United States Patent
Shibasaki

(10) Patent No.: US 8,848,835 B2
(45) Date of Patent: Sep. 30, 2014

(54) INTERPOLATION CIRCUIT, RECEPTION CIRCUIT AND METHOD OF GENERATING INTERPOLATED DATA

(71) Applicant: Fujitsu Limited, Kawasaki (JP)

(72) Inventor: Takayuki Shibasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/827,726

(22) Filed: Mar. 14, 2013

(65) Prior Publication Data

US 2013/0278294 A1 Oct. 24, 2013

(30) Foreign Application Priority Data

Apr. 23, 2012 (JP) ................................ 2012-098205

(51) Int. Cl.
*H03K 9/00* (2006.01)
*H03K 5/00* (2006.01)
*H04B 1/00* (2006.01)

(52) U.S. Cl.
CPC ... *H03K 5/00* (2013.01); *H04B 1/00* (2013.01)
USPC ........... 375/316; 375/346; 375/348; 375/354; 375/355; 375/359; 375/360; 375/371; 375/373

(58) Field of Classification Search
USPC ......... 375/316, 346, 348, 354, 355, 359, 360, 375/371, 373
See application file for complete search history.

(56) References Cited

U.S. PATENT DOCUMENTS

| 2004/0165679 A1 | 8/2004 | Kwak |
| 2005/0259775 A1 | 11/2005 | Chang et al. |
| 2007/0115162 A1* | 5/2007 | Kim .............................. 341/155 |
| 2013/0050005 A1* | 2/2013 | Liu et al. ....................... 341/155 |

FOREIGN PATENT DOCUMENTS

JP 2008-167058 A 7/2008

OTHER PUBLICATIONS

Tina Tahmoureszadeh et al., "A Combined Anti-Aliasing Filter and 2-tap FFE in 65-nm CMOS for 2x Blind 2-10 Gb/s ADC-Based Receivers", IEEE, 2010.

* cited by examiner

*Primary Examiner* — Siu Lee
(74) *Attorney, Agent, or Firm* — Arent Fox LLP

(57) ABSTRACT

An interpolation circuit includes: a generation circuit configured to generate interpolated data based on a plurality of pieces of input data in time sequence; a first analog digital converter configured to convert first interpolated data at a data point of the interpolated data into first digital data; and a second analog digital converter configured to convert second interpolated data at a change point into second digital data of the interpolated data, a second number of quantization bits of the second analog digital converter being smaller than a first number of quantization bits of the first analog digital converter.

20 Claims, 14 Drawing Sheets

US 8,848,835 B2

INTERPOLATION CIRCUIT, RECEPTION CIRCUIT AND METHOD OF GENERATING INTERPOLATED DATA

CROSS-REFERENCE TO RELATED APPLICATION(S)

This application is based upon and claims the benefit of priority of the prior Japanese Patent Application No. 2012-098205, filed on Apr. 23, 2012, the entire contents of which are incorporated herein by reference.

FIELD

The embodiments discussed herein are related to an interpolation circuit, a reception circuit, and a method of generating interpolated data.

BACKGROUND

The data rate of the transmission/reception of signals inside and outside a device intended for a communication backbone or an information processing device such a server can be high. Reception circuits in transmitter-receivers include a synchronous type where sampling is performed in synchronization with the phase of input data and an asynchronous type where sampling is performed out of synchronization with the phase of input data. In an asynchronous type reception circuit, reception data is generated based on sampled data using interpolation.

A related technique is disclosed in "Tina Tahmoureszadeh, Siamak Sarvan, Ali Sheikholeslami, Hirotaka Tamura, Yasumoto Tomita, Masaya Kibune "A Combined Anti-Aliasing Filter and 2-tap FFE in 65-nm CMOS for 2× Blind 2-10 Gb/s ADC-Based Receivers" or the like.

SUMMARY

According to one aspect of the embodiments, an interpolation circuit includes: a generation circuit configured to generate interpolated data based on a plurality of pieces of input data in time sequence; a first analog digital converter configured to convert first interpolated data at a data point of the interpolated data into first digital data; and a second analog digital converter configured to convert second interpolated data at a change point into second digital data of the interpolated data, a second number of quantization bits of the second analog digital converter being smaller than a first number of quantization bits of the first analog digital converter.

The object and advantages of the invention will be realized and attained by means of the elements and combinations particularly pointed out in the claims.

It is to be understood that both the foregoing general description and the following detailed description are example and explanatory and are not restrictive of the invention, as claimed.

DESCRIPTION OF EMBODIMENTS

Input data is equalized or interpolated in order to correct the deterioration of a signal based on a transmission line or the like. An Analog Digital Converter (ADC) converts interpolated data into digital data.

When the data rate of signal transmission/reception has become high, the number of quantization bits of the ADC may become large so as to reduce the deterioration of a receiving sensitivity.

Figure 1A:
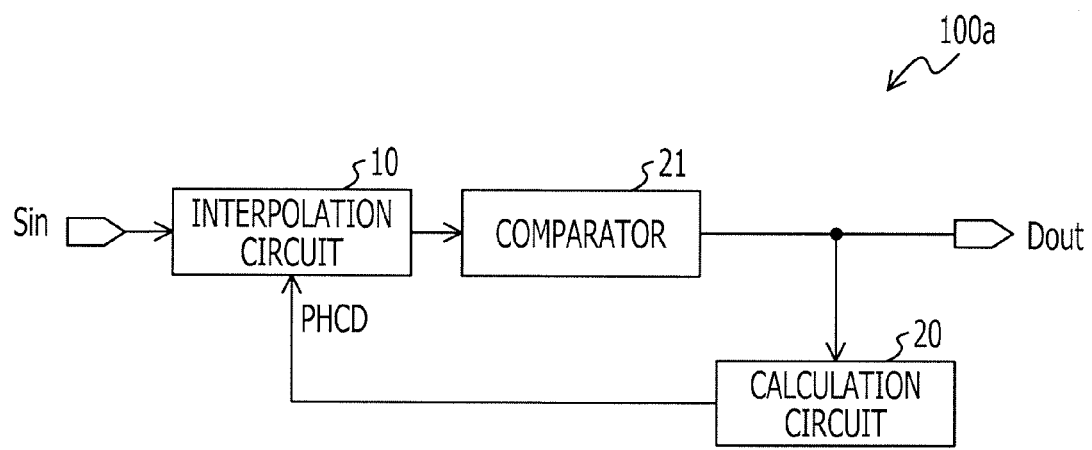
FIG. 1A illustrates an exemplary reception circuit.
Figure 1B:
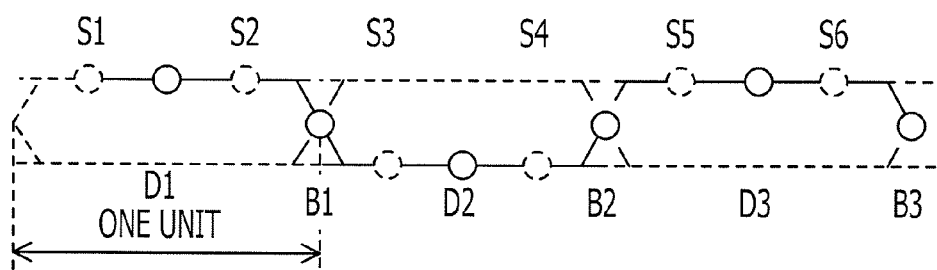
FIG. 1B illustrates an exemplary sampling method.

FIG. 1A illustrates an exemplary reception circuit. A reception circuit illustrated in FIG. 1A may be an asynchronous type reception circuit. FIG. 1B illustrates an exemplary sampling method. A reception circuit 100a illustrated in FIG. 1A includes an interpolation circuit 10, a calculation circuit 20, and a comparator 21. The interpolation circuit 10 generates interpolated data from input data Sin, using a phase code PHCD. By comparing the interpolated data with a reference value, the comparator 21 generates reception data Dout. The calculation circuit 20 detects phase information from the reception data, and calculates the phase code, for example, Interpolation Code PHCD. The calculation circuit 20 may include, for example, a Clock Data Recovery (CDR) circuit.

FIG. 1B illustrates a signal with respect to a time. For example, a 2× method may be used where two pieces of data are sampled in one unit interval, and others methods may also be used. Sn may correspond to input data input in time sequence. The interpolation circuit 10 generates one piece of interpolated data Dn from two pieces of input data Sn−1 and Sn. When an interpolation coefficient k generated from the phase code PHCD satisfies $0 \leq k \leq 1$, the interpolated data Dn is generated in accordance with $Dn=(1-k) \times Sn-1 + k \times Sn$. In this way, interpolated data matching the phase of the input data is generated. The interpolation coefficient k may be a coefficient weighting the input data. In the 2× method, pieces of data are located at a data point and a change point. For example, in FIG. 1B, pieces of data D1, D2, and D3 correspond to the data points, and pieces of data B1, B2, and B3 correspond to the change points.

Figure 2:
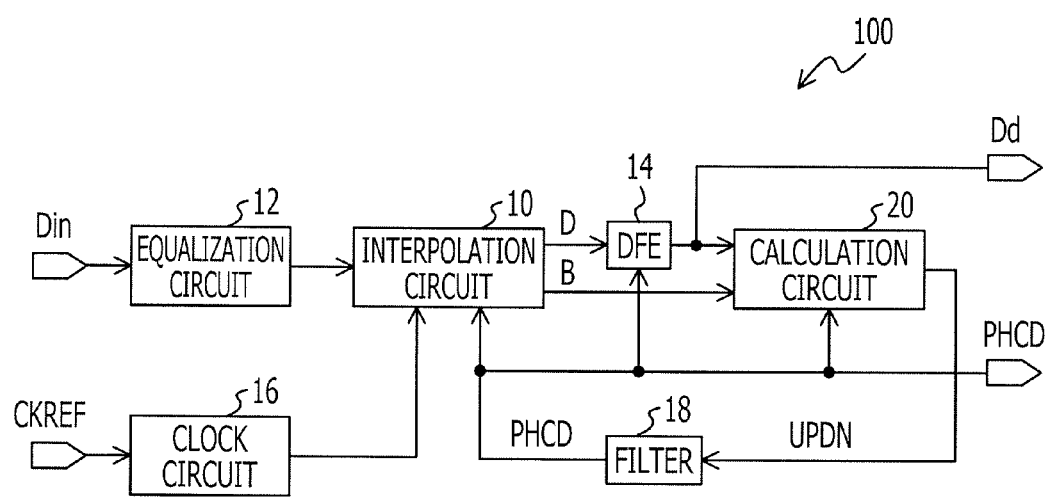
FIG. 2 illustrates an exemplary reception circuit.

FIG. 2 illustrates an exemplary reception circuit. A reception circuit 100 includes an interpolation circuit 10, an equalization circuit 12, a Decision Feedback Equalizer (DFE) 14, a clock circuit 16, a filter 18, and a calculation circuit 20. The clock circuit 16 generates a clock signal from a clock reference signal CKREF, and outputs the clock signal to the interpolation circuit 10. The clock signal may include, for example, CKSn, CKIn, CKRn, and the like. The equalization circuit 12 subjects the input data Sin to equalization processing. As illustrated in FIG. 1B, the interpolation circuit 10 samples the input data with the timing of the clock CKSn, and generates the interpolated data. The DFE 14 performs equalization processing and decision for the data D at the data point, from among pieces of the interpolated data, and outputs as reception data Dd. The calculation circuit 20 outputs a signal UPDN indicating whether the phase of the data B at the change point is early or behind a sampling clock. The filter 18 may be a low-pass filter, and removes the high-frequency wave noise component of the signal UPDN and generates the phase code PHCD.

By subjecting the deteriorated input signal to equalization processing, the equalization circuit 12 reduces the deterioration of a receiving sensitivity. The equalization processing utilizing the DFE 14 may reduce an input noise, and may reduce the deterioration of the receiving sensitivity.

Figure 3:
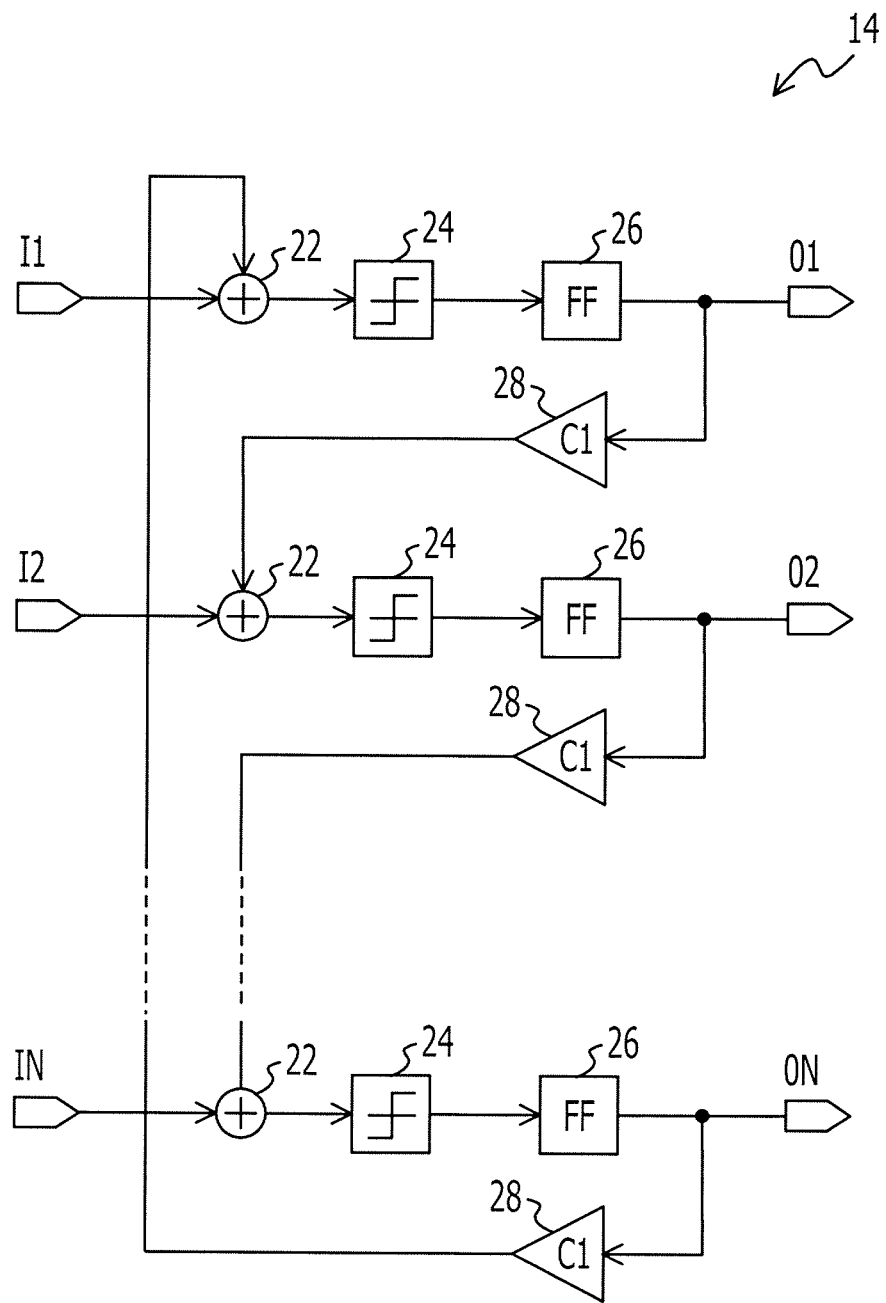
FIG. 3 illustrates an exemplary DFE.

FIG. 3 illustrates an exemplary DFE. The DFE 14 illustrated in FIG. 3 may be, for example, a 1-tap DFE. The DFE 14 equalizes an N-bit digital signal. The DFE 14 includes an addition circuit 22, a decision circuit 24, a flip-flop circuit 26, and a multiplication circuit 28. The addition circuit 22 adds an input signal In to an output signal On−1×C1. The n may be a natural number ranging from 1 to N, and C1 is an equalization coefficient. The decision circuit 24 decides whether the addition circuit 22 is positive or negative. The sign bit of the output of the addition circuit 22 may be set as a decision result without change. The flip-flop circuit 26 adjusts output timing. An output signal On is output from the flip-flop circuit 26. The multiplication circuit 28 multiplies the output signal On by the equalization coefficient C1. The addition circuit 22 adds the output of the multiplication circuit 28 to the input signal In−1.

Each bit of the N-bit output signal On may be On=sign (In+C1×On−1). The sign may correspond to a sign bit. In the 1-tap DFE, a result obtained by multiplying the output signal On−1 preceding by one unit by the equalization coefficient C1 is added to the input signal In, the decision circuit 24 decides whether the addition result is "0" or "1", and the output signal On is output. For example, in a 2-tap DFE, On=sign (In−1+C1×On−1+C2×On−2) may be an output signal. The C2 may be an equalization coefficient.

In the equalization processing utilizing the DFE 14, the input signal In is desired to have resolving power where a quantization error does not influence equalization. Therefore, the number of quantization bits of an ADC within the interpolation circuit 10 may become large.

Figure 4:
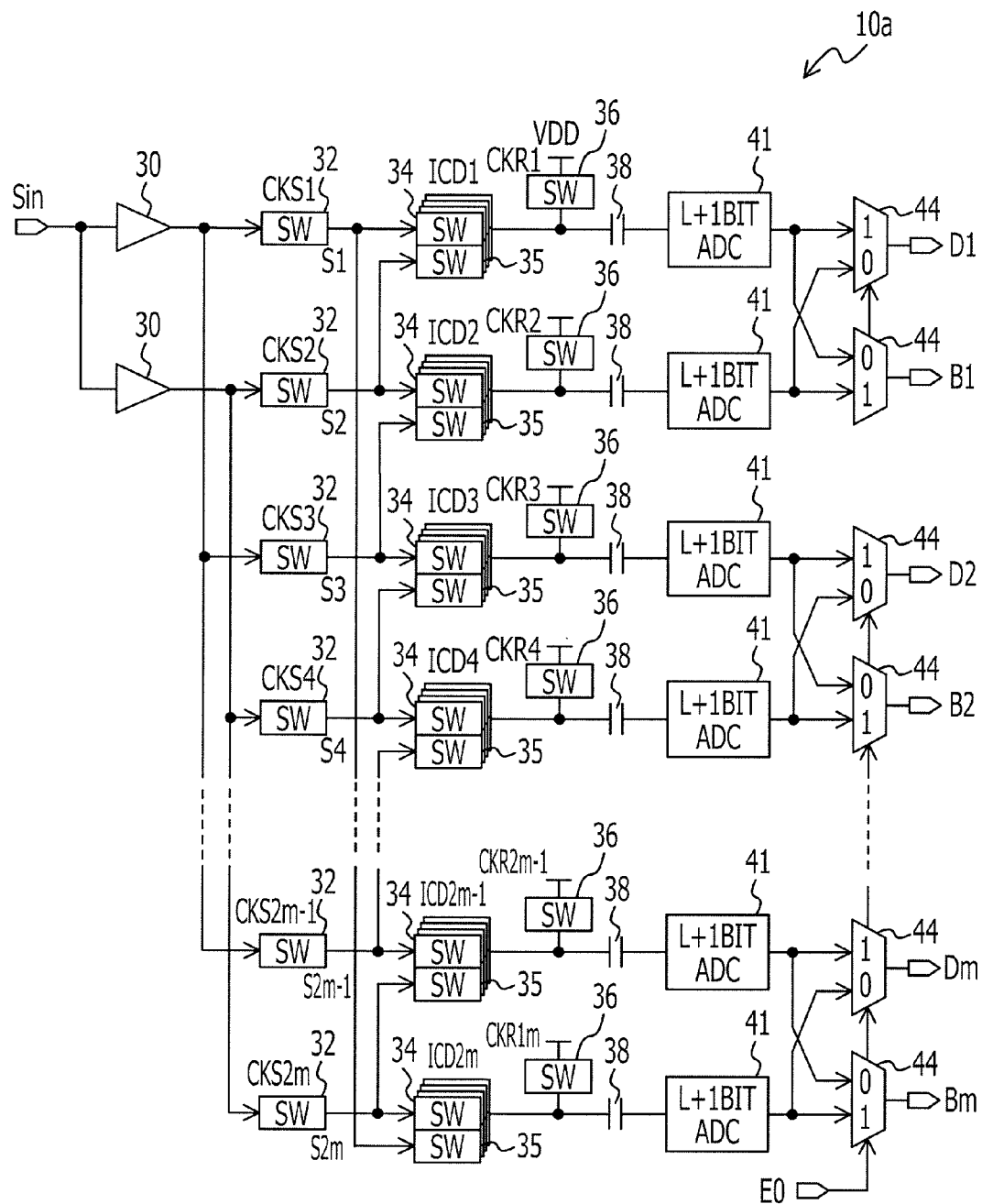
FIG. 4 illustrates an exemplary interpolation circuit.

FIG. 4 illustrates an exemplary interpolation circuit. An interpolation circuit 10a illustrated in FIG. 4 includes an amplifier 30, switches 32 to 36, a capacitor 38, an ADC 41, and a selection circuit 44. The amplifier 30 converts a voltage signal Sin to a current signal. The switch 32 is turned on at the timing of the clock CKSn corresponding to the input data Sn. Individual pieces of input data S1 to SN are output from the switch 32. The n may be a natural number ranging from 1 to 2m. The m may be the number of interleavings. The switches 34 and 35 couple the capacitor 38 to the switch 32 based on a signal ICDn. The switch 36 couples one end of the capacitor 38 to a power source Vdd with the timing of the clock CKRn. The capacitor 38 accumulates therein electric charge. The ADC 41 digital-converts a voltage signal generated by the capacitor 38 with the number of quantization bits including L bits and one bit. The selection circuit 44 outputs the output of the ADC 41, as the Dn or the Bn, based on a signal EO.

Figure 5A:
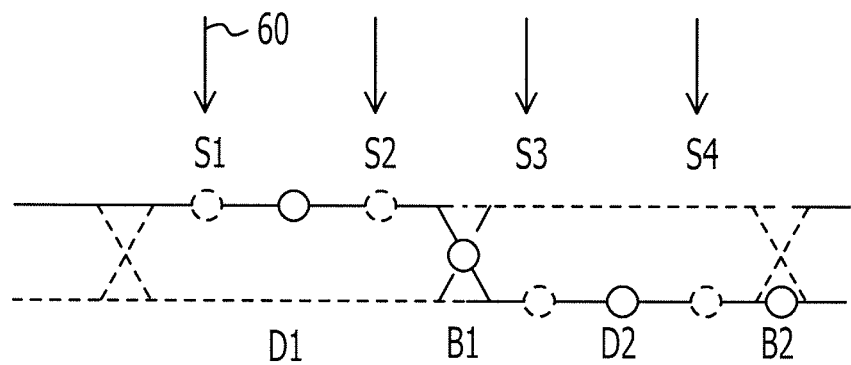
FIG. 5A and FIG. 5B illustrate exemplary eye pattern.
Figure 5B:
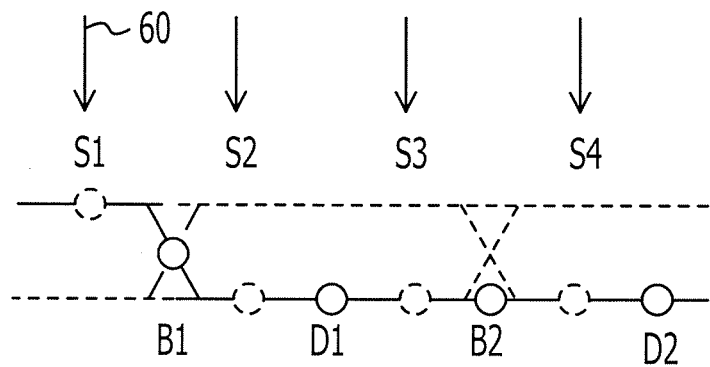

FIG. 5A and FIG. 5B illustrate exemplary eye pattern. In FIG. 5A and FIG. 5B, the function of the selection circuit 44 illustrated in FIG. 4 may be illustrated. For example, in an asynchronous type reception circuit, because the frequency of input data is different from a sampling frequency, a phase difference between the input data and interpolated data changes. In FIG. 5A and FIG. 5B, the edge of the sampling clock CKS is indicated by an arrow 60. When the input data Sn is sampled at the arrow 60, the sampled data may be out of phase with the phase of transmitted data. Therefore, the pieces of the interpolated data Dn and Bn are generated from a plurality of pieces of the input data Sn. The phase of the input data Sn may correspond to the phase of sampling and the phase of the interpolated data may correspond to the phase of the transmitted data. Since there is a phase difference between the input data Sn and the interpolated data Dn, the interpolated data D1 at the data point may be generated (in the case of FIG. 5A) and the interpolated data B1 at the change point may be generated (in the case of FIG. 5B), based on the pieces of the input data S1 and S2. Based on the signal EO, the selection circuit 44 determines whether the interpolated data generated based on the pieces of the input data S1 and S2 is set in the data D1 at the data point or in the data B1 at the change point.

In the interpolation circuit 10a, since the DFE 14 subjects the data D1 at the data point to the equalization processing, the ADC 41 may be used where the number of quantization bits is large. Therefore, a circuit size may become large.

As illustrated in FIG. 3, the number of quantization bits in the data D at the data point output from the interpolation circuit 10 may be large. The data B at the change point can be used for the calculation of the signal UPDN, performed in the calculation circuit 20. The resolving power of one bit may be sufficient for the calculation of the signal UPDN. Therefore, the data at the data point may be converted into digital data by an ADC where the number of quantization bits is large. The data at the change point may be converted into digital data by, for example, a 1-bit ADC.

Figure 6:
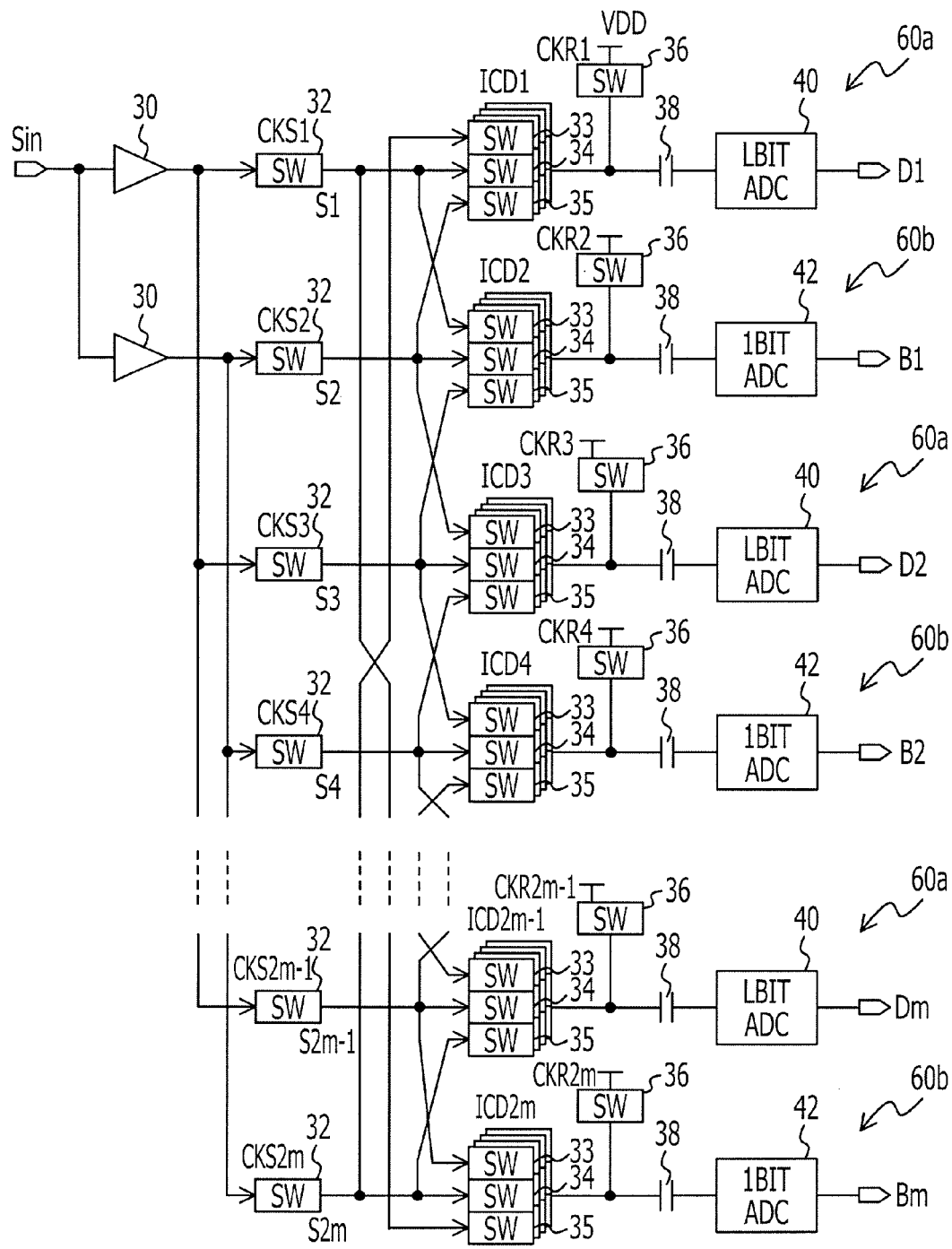
FIG. 6 illustrates an exemplary interpolation circuit.

FIG. 6 illustrates an exemplary interpolation circuit. A capacitor circuit 60a (generation circuit) includes switches 33 to 36, a capacitor 38, and an L-bit ADC 40. The switches 33 to 35 select one of a pair of the pieces of the input data Sn−1 and Sn and a pair of the pieces of the input data Sn and Sn+1. The capacitor 38 outputs interpolated data at the data point. The L-bit ADC 40 may be an ADC where the number of quantization bits corresponds to L bits, and outputs the digital data Dn at the data point.

A capacitor circuit 60b includes switches 33 to 36, a capacitor 38, and a 1-bit ADC 42. The switches 33 to 35 select one of a pair of the pieces of the input data Sn and Sn+1 and a pair of the pieces of the input data Sn+1 and Sn+2. The capacitor 38 outputs interpolated data at the change point. The 1-bit ADC 42 may be an ADC where the number of quantization bits corresponds to 1 bit, and outputs the digital data Bn at the change point. The other configuration may be substantially the same as or similar to the configuration illustrated in FIG. 4.

Figure 7:
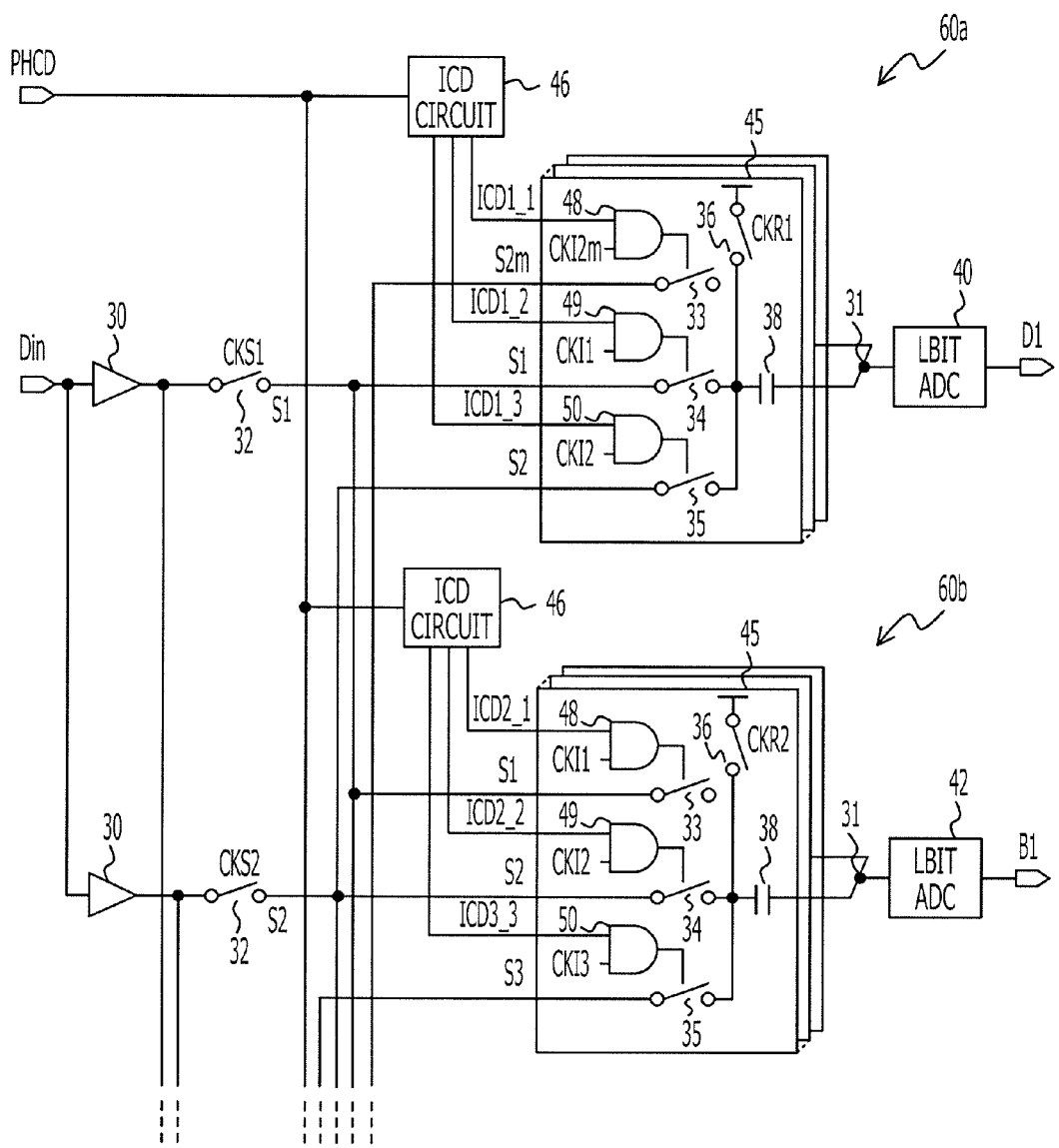
FIG. 7 illustrates an exemplary circuit around a capacitor circuit.

FIG. 7 illustrates an exemplary circuit around a capacitor circuit. Each of capacitor circuits 60a and 60b illustrated in FIG. 7 includes slices 45 whose number is Nc. The Nc may correspond to the resolving power of a phase. Each slice 45 includes AND circuits 48 to 50, switches 33 to 36, and a capacitor 38. The individual slices 45 are coupled in parallel, and the output sides of the individual capacitors 38 are coupled in a node 31. Pieces of input data S2m, S1, and S2 are input to the switches 33 to 35 in the capacitor circuit 60a, respectively. An ICD circuit 46 generates signals ICD1_1 to ICD1_3 based on the phase code PHCD. Clocks CKI2m, CKI1, and CKI2 are input to the AND circuits 48 to 50, respectively, and signals ICD1_1 to ICD1_3 are input to the AND circuits 48 to 50, respectively. When outputs from the AND circuits 48 to 50 are at a high level, the switch 33 to 35 are individually turned on. When the outputs from the AND circuits 48 to 50 are at a low level, the switch 33 to 35 are individually turned off.

When pieces of input data sandwiching therebetween a data point are the S2m and the S1 from among the pieces of the input data S2m, S1, and S2, the ICD circuit 46 puts the signal ICD1_3 into a low level based on the phase code PHCD. The ICD circuit 46 generates an interpolation coefficient kn based on the phase code PHCD. The interpolation coefficient kn may be an integer number satisfying 0≤kn≤Nc. The kn=0 may correspond to k=0, and the kn=Nc may correspond to k=0. The signals ICD1_1 and ICD1_2 may become a high level or a low level in accordance with the interpolation coefficient kn. For example, with respect to the slices 45 whose number is kn from among the slices 45 whose number is Nc, the signal ICD1_1 may become a high level, and the signal ICD1_2 may become a low level. With respect to the slices 45 whose number is Nc−kn, the signal ICD1_1 may become a low level, and the signal ICD1_2 may become a high level. When the capacitance values of the capacitors 38 in the individual slices 45 are substantially the same, the electric charge of a current corresponding to the input data S2m is accumulated in the capacitors 38 whose number is kn. The electric charge of a current corresponding to the input data S1 is accumulated in the capacitors 38 whose number is Nc−kn. Therefore, a voltage corresponding to kn×S2m+(Nc−kn)×S1 is generated in the node 31. As the interpolated data D1 of the data point, kn×S2m+(Nc−kn)×S1 is output from the L-bit ADC 40.

When pieces of input data sandwiching therebetween the data point are the S1 and the S2 from among the pieces of the input data S2m, S1, and S2, the ICD circuit 46 puts the signal ICD1_1 into a low level. The signals ICD1_2 and ICD1_3 may become a high level or a low level in accordance with the interpolation coefficient kn. For example, with respect to the slices 45 whose number is kn from among the slices 45 whose number is Nc, the signal ICD1_2 may become a high level, and the signal ICD1_3 may become a low level. With respect to the slices 45 whose number is Nc−kn, the signal ICD1_2 may become a low level, and the signal ICD1_3 may become a high level. The electric charge of a current corresponding to the input data S1 is accumulated in the capacitors 38 whose number is kn. The electric charge of a current corresponding to the input data S2 is accumulated in the capacitors 38 whose number is Nc−kn. Therefore, as the interpolated data D1 of the data point, kn×S1+(Nc−kn)×S2 is output from the L-bit ADC 40.

Pieces of input data S1, S2, and S3 are input to the switches 33 to 35 in the capacitor circuit 60b, respectively. The ICD circuit 46 generates signals ICD2_1 to ICD2_3 based on the phase code PHCD. Clocks CKI1, CKI2, and CKI3 are input to the AND circuits 48 to 50, respectively, and signals ICD2_1 to ICD2_3 are input to the AND circuits 48 to 50, respectively. When pieces of input data sandwiching therebetween a change point are the S1 and the S2 from among the pieces of the input data S1, S2, and S3, the ICD circuit 46 puts the signal ICD2_3 into a low level based on the phase code PHCD. The signals ICD2_1 and ICD2_2 may become a high level or a low level in accordance with the interpolation coefficient kn. For example, with respect to the slices 45 whose number is kn from among the slices 45 whose number is Nc, the signal ICD2_1 may become a high level, and the signal ICD2_2 may become a low level. With respect to the slices 45 whose number is Nc−kn, the signal ICD2_1 may become a low level, and the signal ICD2_2 may become a high level. When the capacitance values of the capacitors 38 in the individual slices 45 are substantially the same, the electric charge of a current corresponding to the input data S1 is accumulated in the capacitors 38 whose number is kn. The electric charge of a current corresponding to the input data S2 is accumulated in the capacitors 38 whose number is Nc−kn. Therefore, a voltage corresponding to kn×S1+(Nc−kn)×S2 is generated in the node 31. As the interpolated data D1 of the change point, a low level signal or a high level signal is output from the 1-bit ADC 42.

When pieces of input data sandwiching therebetween the change point are the S2 and the S3 from among the pieces of the input data S1, S2, and S3, the ICD circuit 46 puts the signal ICD2_1 into a low level. The signals ICD2_2 and ICD2_3 may become a high level or a low level in accordance with the interpolation coefficient kn. For example, with respect to the slices 45 whose number is kn from among the slices 45 whose number is Nc, the signal ICD2_2 may become a high level, and the signal ICD2_3 may become a low level. With respect to the slices 45 whose number is Nc−kn, the signal ICD2_2 may become a low level, and the signal ICD2_3 may become a high level. The electric charge of a current corresponding to the input data S2 is accumulated in the capacitors 38 whose number is kn. The electric charge of a current corresponding to the input data S3 is accumulated in the capacitors 38 whose number is Nc−kn. Therefore, as the interpolated data D1 of the change point, kn×S2+(Nc−kn)×S3 is output from the 1-bit ADC 42.

Figure 8:
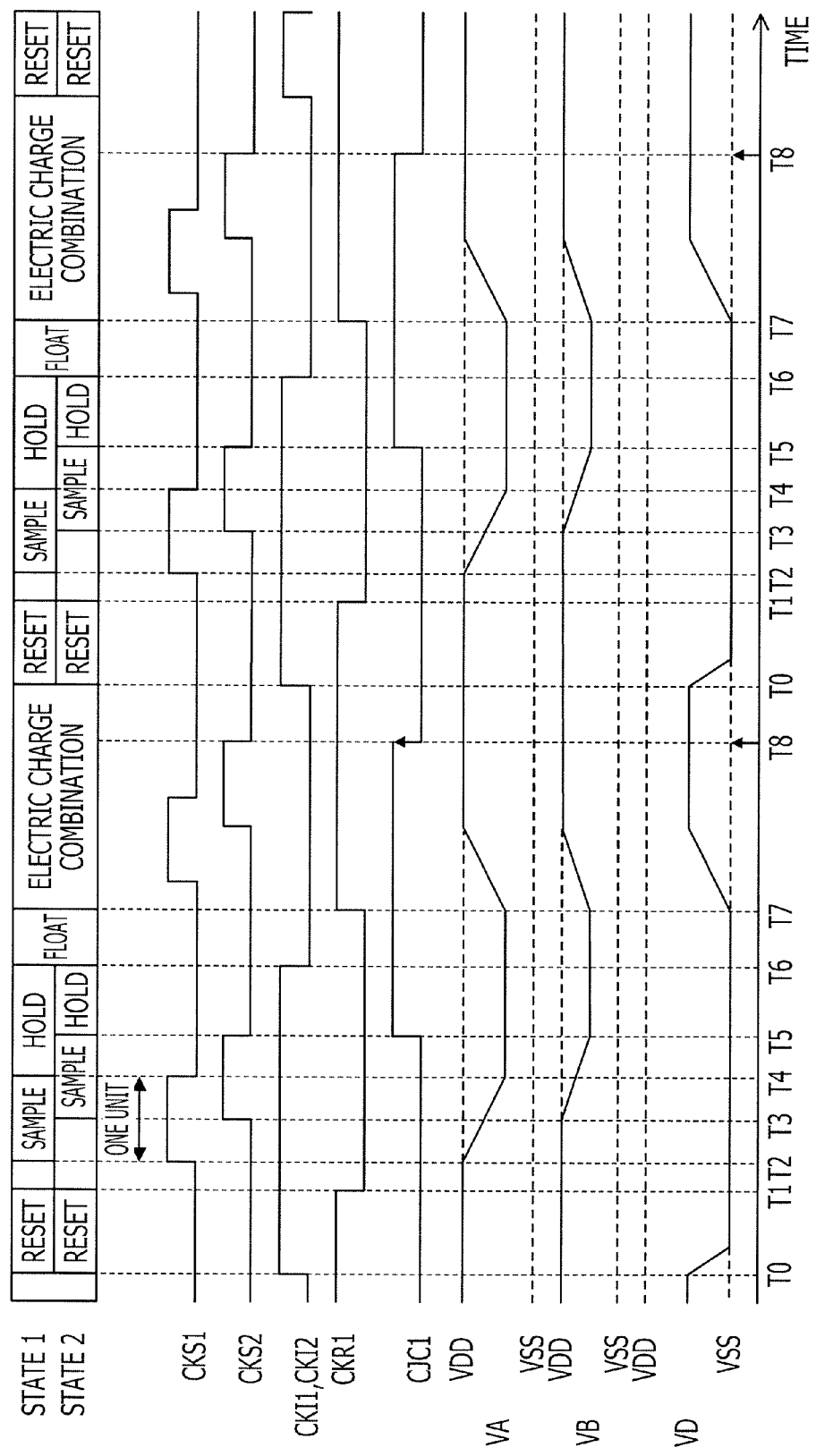
FIG. 8 illustrates an exemplary timing chart of an interpolation circuit.

FIG. 8 illustrates an exemplary timing chart of an interpolation circuit. In FIG. 8, the timing of the capacitor circuit 60a when the data D1 is generated based on the pieces of the input data S1 and S2 is illustrated. A state 1 and a state 2 individually indicate the states of the slice 45 where currents corresponding to the pieces of the input data S1 and S2 are applied to the capacitor 38. Voltages Va and Vb indicate the output voltages of the capacitor 38 of the slice in the states 1 and 2, respectively. A voltage VD indicates the voltage of the node 31. Vdd and Vss may be a power-supply voltage and a ground voltage, respectively.

At time t0, clocks CKS1, CKS2, and CKC1 may be at a low level. The clock CKR1 may be at a high level. The clocks CKI1 and CKI2 may become a high level. The switches 34 and 35 in the slice 45 are turned on, and the switch 33 is turned off. The states 1 and 2 may be reset states. At time t1, the clock CKR1 becomes a low level. Therefore, the switch 36 is turned off. At time t2, the clock CKR1 becomes a high level. Therefore, the switch 32 corresponding to the input data S1 is turned on. Electric charge corresponding to the input data S1 is pulled out from the capacitor 38 in the slice 45 in the state 1. Therefore, the voltage Va of the capacitor 38 becomes lower. At time t3, the clock CKS2 becomes a high level. Therefore, the switch 32 corresponding to the input data S2 is turned on. Electric charge corresponding to the input data S2 is pulled out from the capacitor 38 in the slice 45 in the state 2. Therefore, the voltage Vb of the capacitor 38 becomes lower.

At time t4, the clock CKS1 becomes a low level, and the switch 32 corresponding to the input data S1 is turned off. In the slice 45 in the state 1, a time period between time t2 and time t4 is a time period when electric charge corresponding to the input data S1 is sampled from the capacitor 38. At time t5, the clock CKS2 becomes a low level, and the switch 32 corresponding to the input data S2 is turned off. In the slice 45 in the state 2, a time period between time t3 and time t5 is a time period when electric charge corresponding to the input data S2 is sampled from the capacitor 38. At time t6, clocks CKI1 and CKI2 become a low level. Therefore, switches 33 to 35 may be turned off. A time period between time t4 and time t6 is a hold state where the capacitor 38 in the slice 45 in the state 1 holds electric charge. A time period between time t5 and time t6 is a hold state where the capacitor 38 in the slice 45 in the state 2 holds electric charge. At time t7, the clock CKR1 becomes a high level. The switch 36 is turned on. In the node 31, the electric charge pulled out from the capacitor 38 in the slice 45 is combined, and the voltage VD increases. At the time of t8 when the voltage VD has become stable, the clock CKC1 becomes a low level. At this timing (up-pointing arrow), the ADC 40 digital-converts the voltage VD.

When the clocks CKS1 and the CKS2 become a high level in a time period when clocks CKI1 and CKI2 are at a low level, since the switches 33 to 35 are turned off, there may be no influence on the capacitor circuit 60a. A time period from time t7 to the subsequent time of t0 may be an electric charge combination state. In the capacitor circuit 60b, in the same way, the data B of the change point may also be generated.

Figure 9:
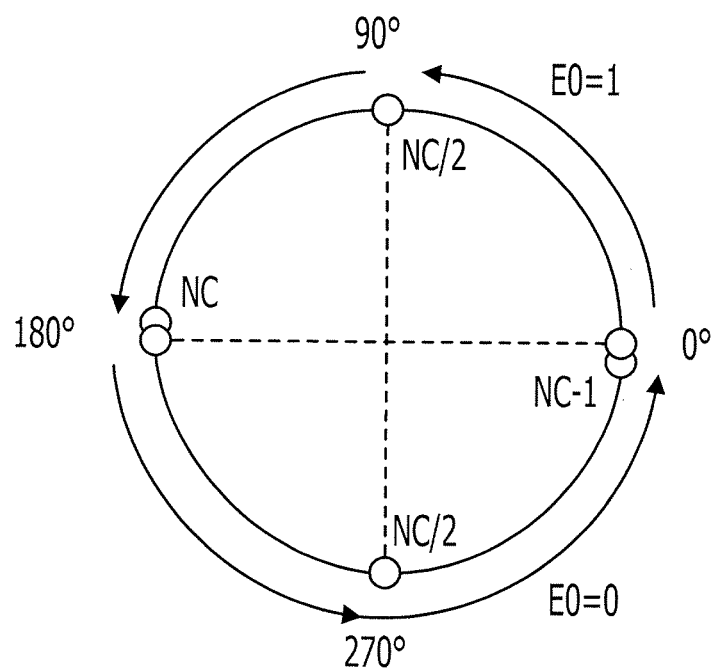
FIG. 9 illustrates an exemplary phase code.

FIG. 9 illustrates an exemplary phase code. In FIG. 9, when the phase code PHCD is 0 degree, the phases of transmitted data and the sampling clock coincide with each other. For example, the phases of the input data S1 and the interpolated data D1 at the data point may coincide with each other. The interpolation coefficient kn=0 may be satisfied. When the phase is 90 degrees, the interpolated data D1 at the data point is located between the pieces of the input data S1 and S2, and the interpolation coefficient kn may be Nc/2. When the phase is 180 degrees, the phases of the input data S1 and the interpolated data B1 at the change point coincide with each other, and the interpolation coefficient kn may be 0. When a phase difference is greater than or equal to 0 degree and less than 180 degrees (for example, the interpolation coefficient kn is from 0 to Nc−1), the signal EO=1 may be satisfied. When the phase is 270 degrees, the interpolated data B1 at the change point is located between the pieces of the input data S1 and S2, and the interpolation coefficient kn may be Nc/2. When the phase difference is greater than or equal to 180 degrees and less than 360 degrees (for example, the interpolation coefficient kn is from 0 to Nc−1), the signal EO=1 may be satisfied.

Figure 10A:
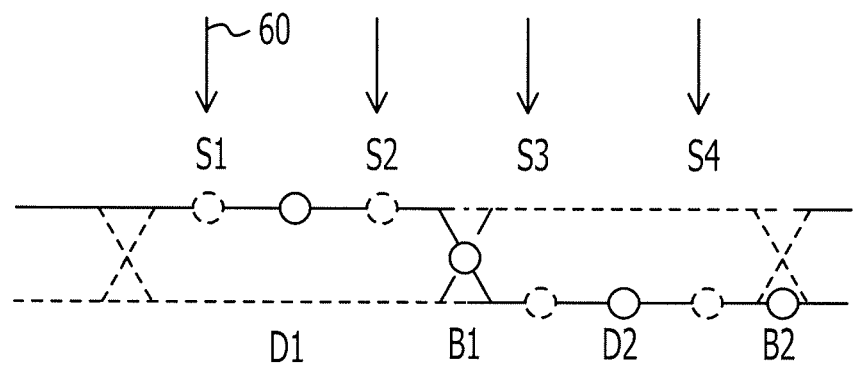
FIG. 10A and FIG. 10B illustrate exemplary eye pattern.
Figure 10B:
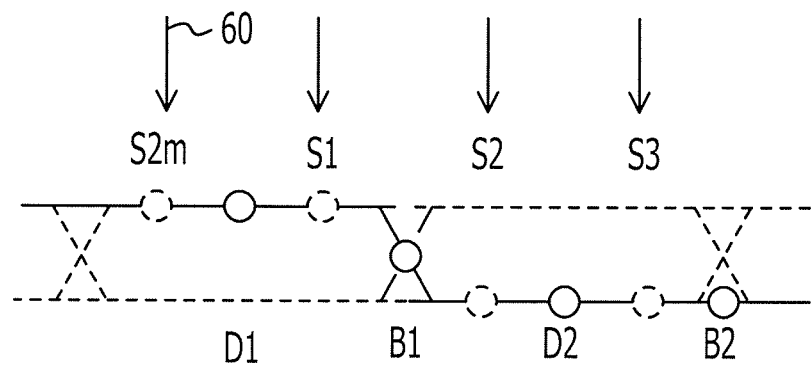

FIG. 10A and FIG. 10B illustrate an exemplary eye pattern. As illustrated in FIG. 10A, when the signal EO=1 is satisfied, the capacitor circuit 60a illustrated in FIG. 7 generates the interpolated data D1 at the data point based on the pieces of the input data S1 and S2. The capacitor circuit 60b generates the interpolated data B1 at the change point based on the pieces of the input data S2 and S3. As illustrated in FIG. 10B, when the signal EO=0 is satisfied, the capacitor circuit 60a generates the interpolated data D1 at the data point based on the pieces of the input data S2m and S1. The capacitor circuit 60b generates the interpolated data B1 at the change point based on the pieces of the input data S1 and S2.

As illustrated in FIG. 7, the capacitor circuits 60a and 60b generate the interpolated data based on a plurality of pieces of data from among the input data. The ADC 40 converts the interpolated data D at the data point into digital data. The ADC 42 converts the interpolated data at the change point into digital data. The number of quantization bits of the ADC 42 is smaller than that of the ADC 40. The resolving power of the data at the change point may be smaller than that of the data at the data point. The circuit size of an ADC may be reduced that corresponds to the change point where the number of quantization bits is allowed to be small. Therefore, the circuit size of the interpolation circuit 10 may be reduced. For example, when the number of quantization bits of the ADC 40 corresponds to L bits and the number of interleavings is m, comparators corresponding to m×(L+1) bits may be reduced.

The number of quantization bits of the ADC 42 may not correspond to one bit. When the number of quantization bits of the ADC 42 corresponds to one bit, a circuit size may be reduced.

The DFE 14 performs quantization for the interpolated data at the data point. When the DFE 14 performs quantization, a quantization error may influence the quantization. When the DFE 14 is used, the ADC 40 may increase the number of quantization bits. The DFE 14 may be used as an equalization circuit, and another equalization circuit may be used.

As illustrated in FIG. 7, the capacitor circuits 60a and 60b select one of pieces of data adjacent to each other in time sequence from among a plurality of pieces of the data Sn. The capacitor circuits 60a and 60b output interpolated data at the data point to the ADC 40, and output interpolated data at the change point to the ADC 42. Therefore, the ADC 40 digital-converts data at the data point, and the ADC 42 digital-converts data at the change point.

As illustrated in FIG. 7 and FIG. 9, the capacitor circuits 60a and 60b select one of pieces of data adjacent to each other based on a phase difference between the input data Sn and the interpolated data Dn. The capacitor circuit 60a and 60b may easily select one of pieces of data adjacent to each.

Figure 11:
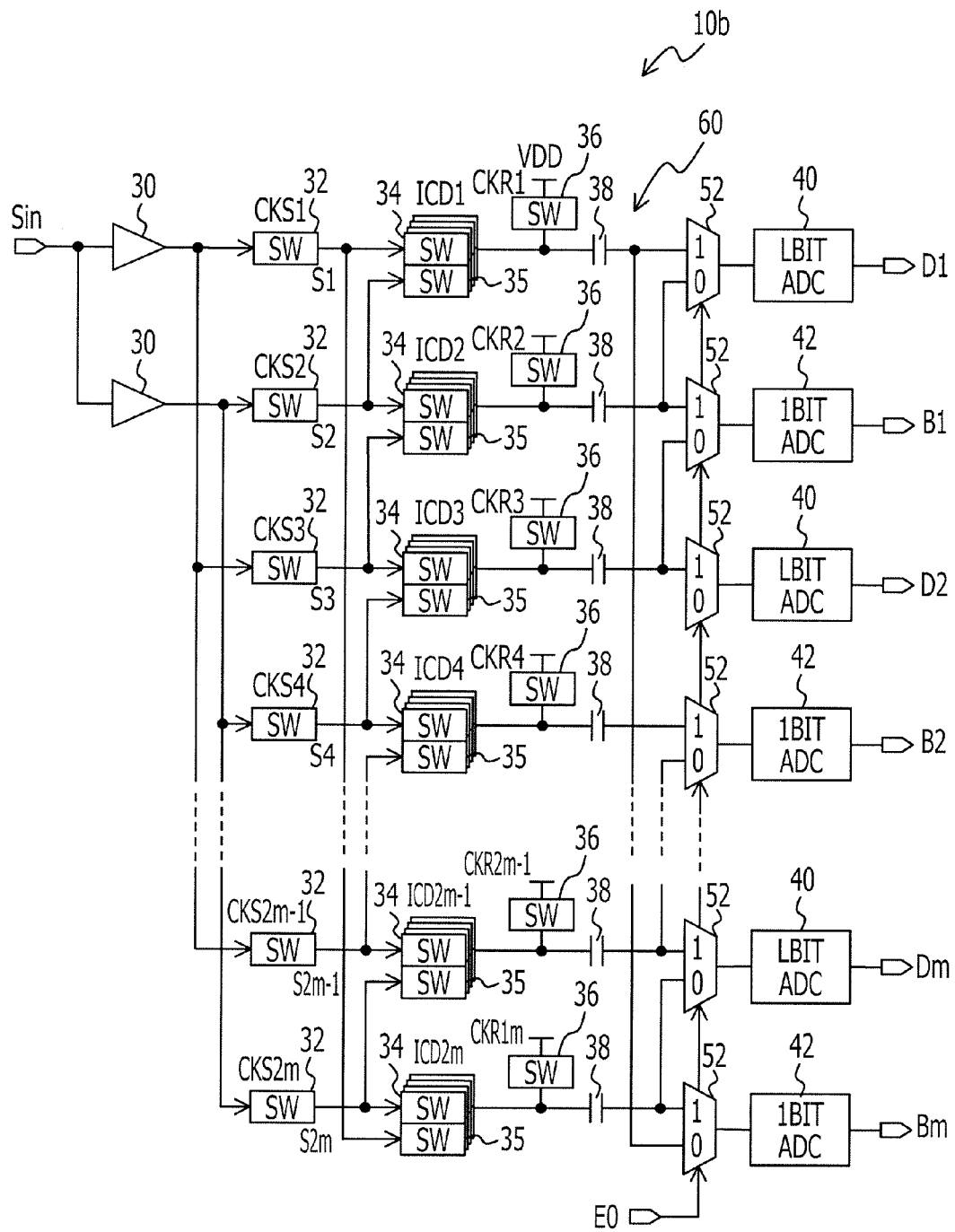
FIG. 11 illustrates an exemplary interpolation circuit.

FIG. 11 illustrates an exemplary interpolation circuit. In an interpolation circuit 10b illustrated in FIG. 11, a selection circuit 52 is coupled between a capacitor 38 in a capacitor circuit 60 and each of the ADC 40 and the ADC 42. When the signal EO is 1, the selection circuit 52 outputs interpolated data generated based on the pieces of the input data S1 and S2 to the L-bit ADC 40, and outputs interpolated data generated based on the pieces of the input data S2 and S3 to the 1-bit ADC 42. When the signal EO is 0, the selection circuit 52 outputs interpolated data generated based on the pieces of the input data S1 and S2 to the 1-bit ADC 42, and outputs interpolated data generated based on the pieces of the input data S2 and S3 to the L-bit ADC 40.

Figure 12:
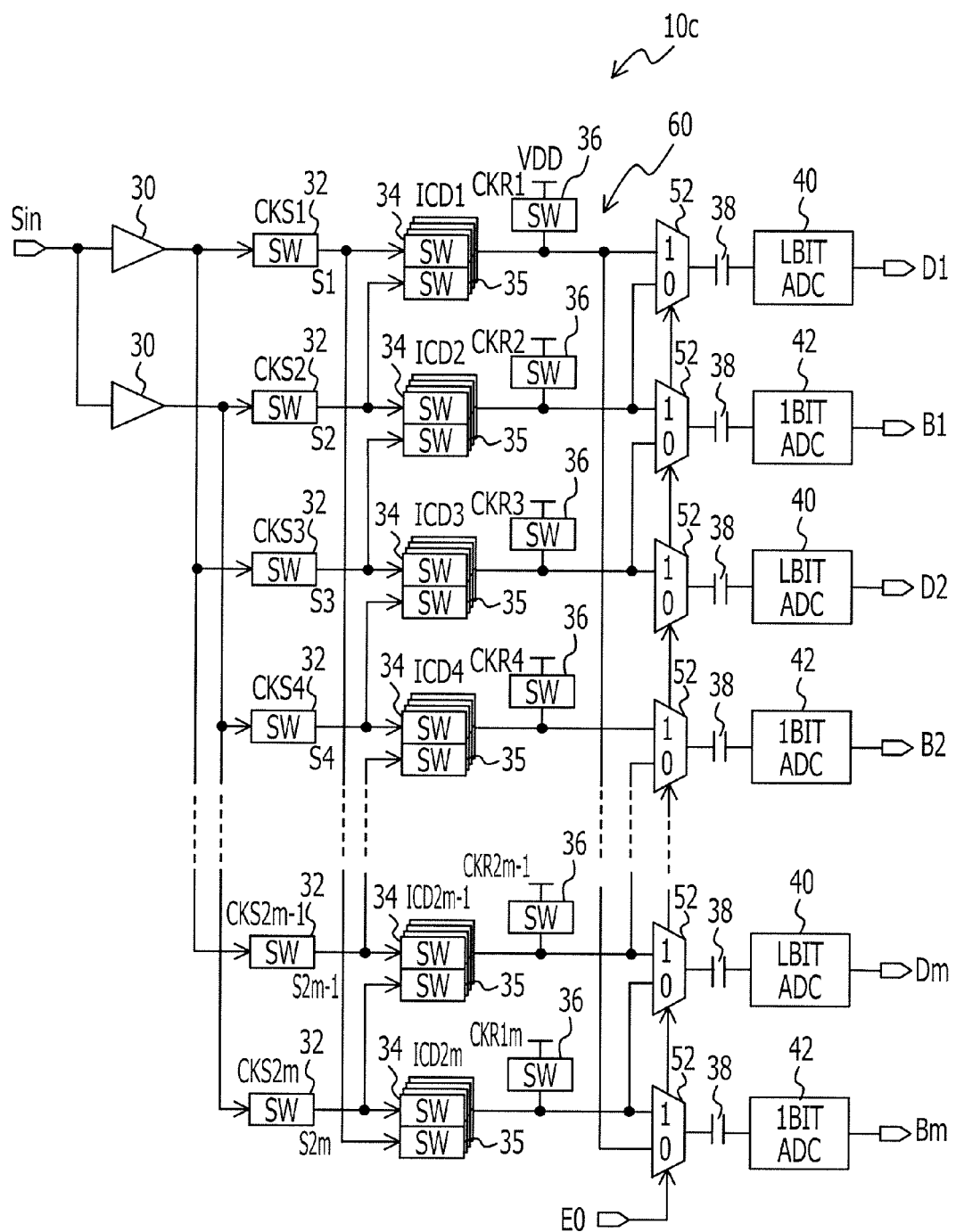
FIG. 12 illustrates an exemplary interpolation circuit.

FIG. 12 illustrates an exemplary interpolation circuit. As illustrated in FIG. 12, the selection circuit 52 in an interpolation circuit 10c may be provided between the switch 36 and the capacitor 38. The other configuration illustrated in FIG. 12 may be substantially the same as or similar to the configuration illustrated in FIG. 11.

Figure 13:
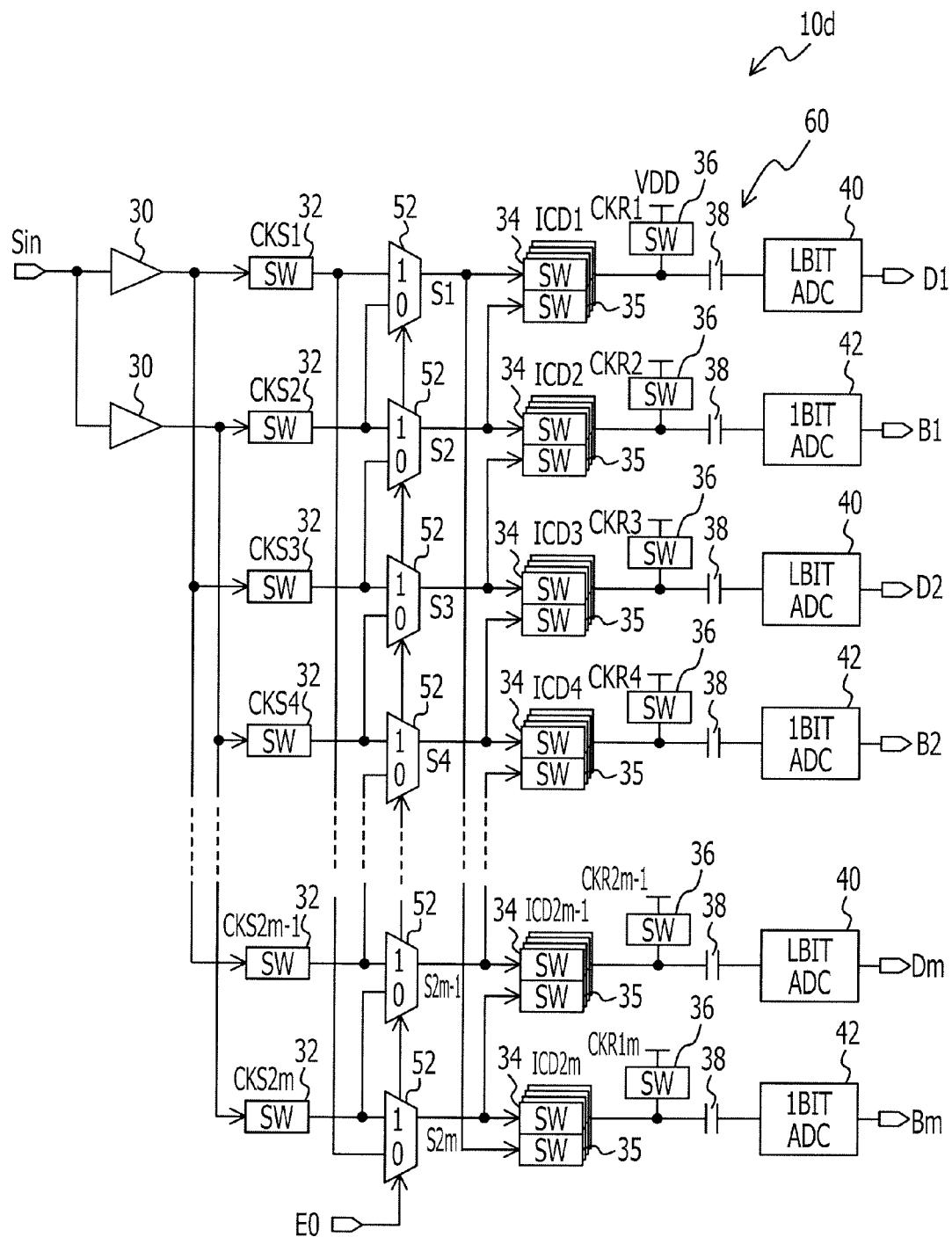
FIG. 13 illustrates an exemplary interpolation circuit.

FIG. 13 illustrates an exemplary interpolation circuit. As illustrated in FIG. 13, the selection circuit 52 in an interpolation circuit 10d may be provided between switch 32 and switches 34 and 35. The other configuration illustrated in FIG. 13 may be substantially the same as or similar to the configuration illustrated in FIG. 11.

The selection circuit 52 selects whether to output the interpolated data to the ADC 40 or the ADC 42. Therefore, the ADC 40 digital-converts data at the data point, and the ADC 42 digital-converts data at the change point.

Based on a phase difference between the input data and the interpolated data, the selection circuit 52 selects whether to output the interpolated data to the ADC 40 or the ADC 42. Therefore, the selection circuit 52 may easily output the data at the data point and the data at the change point to the ADC 10 and the ADC 42, respectively.

Figure 14:
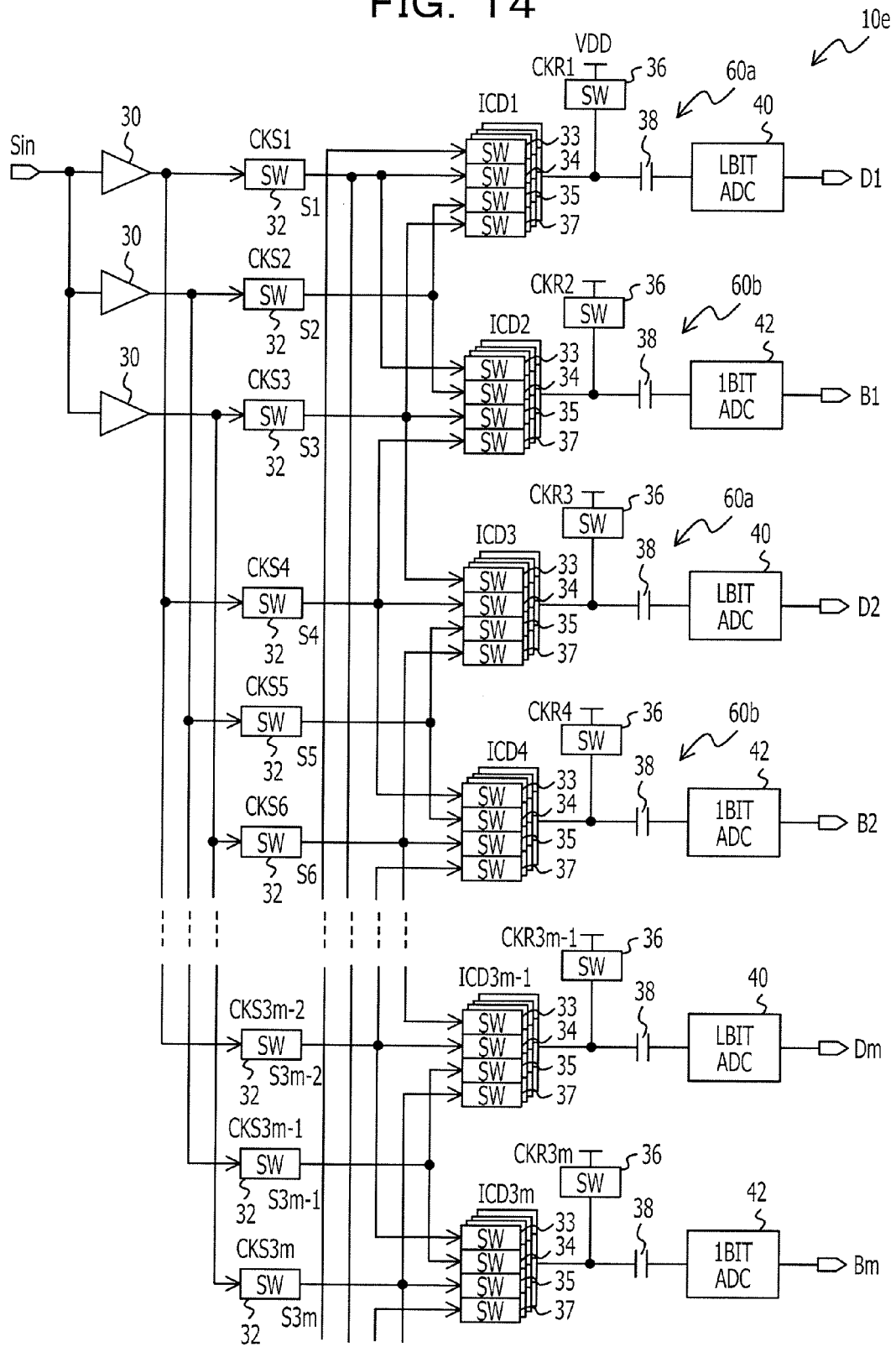
FIG. 14 illustrates an exemplary interpolation circuit.

FIG. 14 illustrates an exemplary interpolation circuit. In an interpolation circuit illustrated in FIG. 14, a 3× method may be adopted. Capacitor circuits 60a and 60b in an interpolation circuit 10e illustrated in FIG. 14 include switches 33, 34, 35, and 37. Pieces of input data S3m, S1, S2, and S3 are input to the switches 33, 34, 35, and 37 in the capacitor circuit 60a, respectively. Pieces of input data S1, S2, S3, and S4 are input to the switches 33, 34, 35, and 37 in the capacitor circuit 60b, respectively. The capacitor circuit 60a selects two pieces of the input data sandwiching therebetween the data point, from among four pieces of the input data, and generates interpolated data at the data point based on the selected pieces of data. The capacitor circuit 60b selects two pieces of the input data sandwiching therebetween the change point, from among four pieces of the input data, and generates interpolated data at the change point based on the selected pieces of data. Since the four pieces of data correspond to one unit, the data point and the change point are included among the four pieces of data. Therefore, in the 3× method, the interpolated data at the data point and the change point may also be generated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An interpolation circuit comprising:
   a generation circuit configured to generate interpolated data based on a plurality of pieces of input data in time sequence;
   a first analog digital converter configured to convert first interpolated data at a data point of the interpolated data into first digital data; and
   a second analog digital converter configured to convert second interpolated data at a change point into second digital data of the interpolated data, a second number of quantization bits of the second analog digital converter being smaller than a first number of quantization bits of the first analog digital converter.

2. The interpolation circuit according to claim 1, further comprising:
   an equalization circuit configured to equalize the interpolated data at the data point.

3. The interpolation circuit according to claim 2, wherein the equalization circuit includes a decision feedback equalizer.

4. The interpolation circuit according to claim 1, wherein the generation circuit, based on a selection of pieces of input data adjacent in time sequence from among the plurality of pieces of input data, outputs the first interpolated data to the first analog digital converter and outputs the second interpolated data to the second analog digital converter.

5. The interpolation circuit according to claim 4, wherein the selection is performed based on a phase difference between the input data and the interpolated data.

6. The interpolation circuit according to claim 1, further comprising:
   a selection circuit configured to select at least one of the first interpolated data and the second interpolated data.

7. The interpolation circuit according to claim 6, wherein the selection circuit performs a selection based on a phase difference between the input data and the interpolated data.

8. The interpolation circuit according to claim 1, wherein the number of quantization bits of the second analog digital converter corresponds to one bit.

9. A reception circuit comprising:
   an interpolation circuit configured to output digital interpolated data based on input data input in time sequence; and
   a calculation circuit configured to detect a phase difference between the input data and the digital interpolated data,
   wherein the interpolation circuit includes a generation circuit configured to generate interpolated data, a first analog digital converter configured to convert the interpolated data at a data point into digital data, and a second analog digital converter configured to convert the interpolated data at a change point into digital data, a number of quantization bits of the second analog digital converter is smaller than a number of quantization bits of the first analog digital converter.

10. The reception circuit according to claim 9, wherein the calculation circuit calculates a phase difference between the input data and the digital interpolated data, using the interpolated data at the change point.

11. The reception circuit according to claim 9, wherein the interpolation circuit further comprises:
    an equalization circuit configured to equalize the interpolated data at the data point.

12. The reception circuit according to claim 11, wherein the equalization circuit includes a decision feedback equalizer.

13. The reception circuit according to claim 9, wherein the generation circuit, based on a selection of pieces of input data adjacent in time sequence from among the plurality of pieces of input data, outputs the first interpolated data to the first analog digital converter and outputs the second interpolated data to the second analog digital converter.

14. The reception circuit according to claim 13, wherein the selection is performed based on a phase difference between the input data and the interpolated data.

15. The reception circuit according to claim 9, further comprising:
    a selection circuit configured to select at least one of the first interpolated data and the second interpolated data.

16. The reception circuit according to claim 15, wherein the selection circuit performs a selection based on a phase difference between the input data and the interpolated data.

17. The reception circuit according to claim 9, wherein the number of quantization bits of the second analog digital converter corresponds to one bit.

18. A method of generating interpolated data, the method comprising:
    generating interpolated data based on a plurality of pieces of input data in time sequence;
    converting first interpolated data at a data point of the interpolated data into first digital data by a first analog digital converter; and
    converting second interpolated data at a change point into second digital data of the interpolated data by a second analog digital converter, a second number of quantization bits of the second analog digital converter being smaller than a first number of quantization bits of the first analog digital converter.

19. The method according to claim 18, further comprising:
    calculating a phase difference between the input data and the interpolated data, using interpolated data at a change point.

20. The method according to claim 18, further comprising:
    equalizing the interpolated data at the data point.

* * * * *